(12) United States Patent
Polizzi et al.

(10) Patent No.: US 6,990,596 B2
(45) Date of Patent: Jan. 24, 2006

(54) MEMORY DEVICE OUTPUTTING READ DATA IN A TIME STARTING FROM A RISING EDGE OF AN EXTERNAL CLOCK THAT IS SHORTER THAN THAT OF KNOWN DEVICES

(75) Inventors: Salvatore Polizzi, San Giovanni La Punta (IT); Maurizio Perroni, Furnari (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 532 days.

(21) Appl. No.: 10/325,486

(22) Filed: Dec. 19, 2002

(65) Prior Publication Data
US 2003/0123306 A1    Jul. 3, 2003

(30) Foreign Application Priority Data
Dec. 20, 2001  (EP) .................................. 01830782

(51) Int. Cl.
*G06F 13/42*   (2006.01)
*H03H 11/26*   (2006.01)
*G11C 7/00*   (2006.01)

(52) U.S. Cl. ........................ 713/400; 327/263; 365/194

(58) Field of Classification Search .............. 713/400, 713/401; 327/161, 261, 263; 365/194; 711/170
See application file for complete search history.

(56) References Cited

U.S. PATENT DOCUMENTS

| 5,124,589 | A | | 6/1992 | Shiomi et al. ............... 307/465 |
| 6,094,380 | A | * | 7/2000 | Kim ............................. 365/194 |
| 6,169,435 | B1 | * | 1/2001 | Fujii et al. ................... 327/261 |
| 6,426,900 | B1 | * | 7/2002 | Maruyama et al. ......... 365/194 |
| 6,763,444 | B2 | * | 7/2004 | Thomann et al. ........... 711/170 |

FOREIGN PATENT DOCUMENTS

| JP | 2000057771 A | * | 2/2000 |
| WO | 99/15971 | | 4/1999 |

* cited by examiner

*Primary Examiner*—Thomas Lee
*Assistant Examiner*—Suresh K Suryawanshi
(74) *Attorney, Agent, or Firm*—Lisa K. Jorgenson; Allen, Dyer, Doppelt, Milbrath & Gilchrist, P.A.

(57) ABSTRACT

The memory device of the invention outputs the read data in a time starting from the rising edge of the external clock that is shorter than that of other known devices, because the output buffer has an array of master-slave pairs of flip-flops synchronized by respective timing signals derived from the internal clock signal. The array receives data from the state machine through the second internal bus and provides the data to be output to the output stage of the buffer enabled by the state machine. A logic circuit generates timing signals for the master-slave flip-flops, respectively as logic NAND and logic AND of the internal clock signal and of an enabling signal of the output stage of the buffer generated by the state machine. Moreover, the memory device includes a circuit, synchronized by the internal clock signal, that introduces a delay of the enabling signal of the output stage of the buffer equivalent to a period of the internal clock signal.

19 Claims, 4 Drawing Sheets

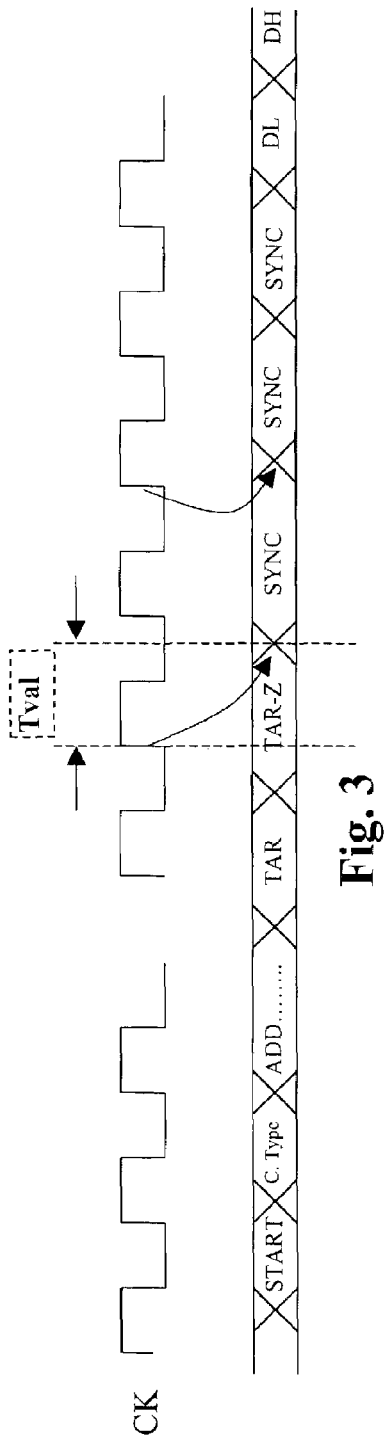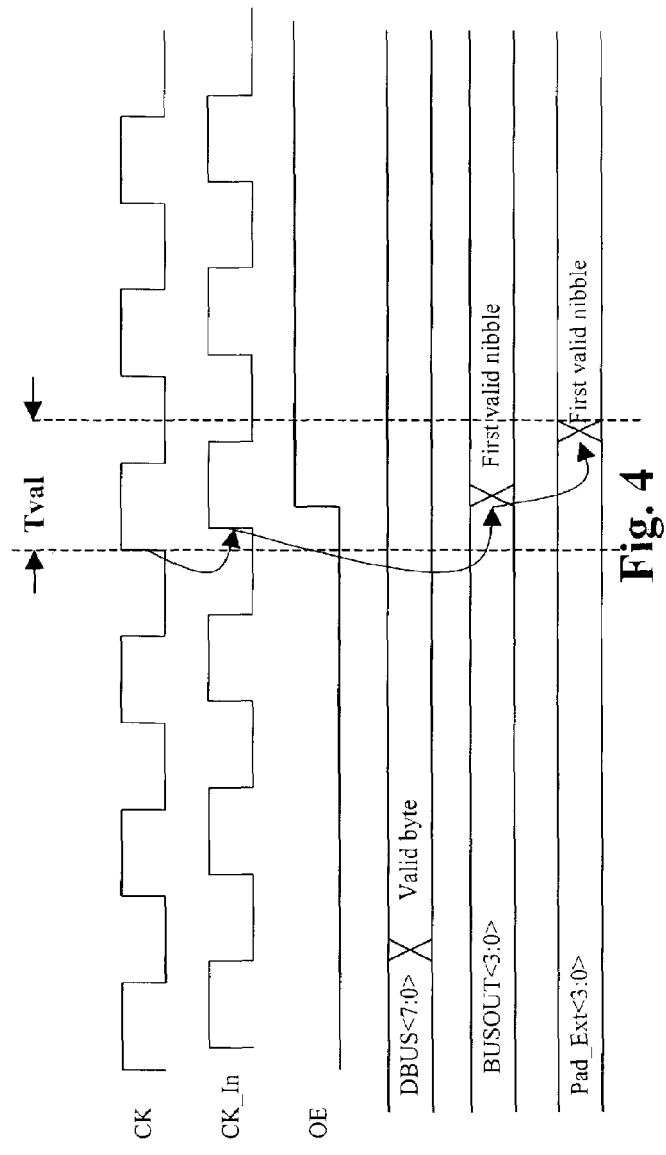

MEMORY DEVICE OUTPUTTING READ DATA IN A TIME STARTING FROM A RISING EDGE OF AN EXTERNAL CLOCK THAT IS SHORTER THAN THAT OF KNOWN DEVICES

FIELD OF THE INVENTION

The present invention relates in general to memory devices, and in particular, to volatile and non-volatile memory devices.

BACKGROUND OF THE INVENTION

There are many applications for volatile and non-volatile memory devices, such as digital cameras, measurement instruments and the like. A functional block diagram of a common memory device is shown in FIG. 1, purposely emphasizing only the output path of=data read from the memory. The data output path includes essentially a state machine OUTPUT_LPC controlling the stream of data as it is read from a standard memory core FLASH_CORE and placed on a first internal data bus DBUS<7:0> and an output buffer OUT_BUFFER, coupled to the state machine through a second internal bus BUSOUT<3:0>.

An internal timing signal CK_IN, generated by the internal buffer IN_BUFFER input with the external clock CK, synchronizes the execution of the operations of the state machine. The state machine receives data coming from the standard memory core FLASH_CORE through the internal data bus DBUS<7:0>, which may typically be an eight bit bus, and conveys them in serial mode with proper timing to the output buffer OUT_BUFFER. This buffer is enabled by an enabling signal OE generated by the state machine and includes an output stage FINAL_STAGE that produces the data on the output bus PAD_EXT<3:0>. Several largely used protocols require that the data read from the memory be made available on the output bus PAD_EXT<3:0> by a pre-established maximum time starting from the rising edge of the external clock. Because of delays of propagation of digital signals through the circuitry present along the output path of the memory device, it may be difficult to meet such a fundamental requirement.

To more clearly illustrate the addressed technical problem, a well known type of memory device will be considered in conjunction with an equally well known type of protocol that specifically sets such a maximum time. In the ensuing description, reference will be made to an LPC (Low Pin Count) protocol, which is particularly important because of its popularity and widespread use, however all the considerations that will be made are valid, with the respective differences having been considered, even for other protocols setting the same requirement, such as the well known PCI and SPI protocols. For each cycle of the LPC protocol, only one byte is read in the way illustrated in FIG. 2. For the first twelve clock pulses, the external host of the memory device controls a system bus I/O (not shown in FIG. 1) connected to the output bus PAD_EXT<3:0>. During this first group of clock pulses the external host provides codes to the input circuits of the memory device for accessing the standard memory core thereof FLASH_CORE.

The sequence of twelve clock pulses is so subdivided: one pulse for the START phase, one pulse for the CYCLE_TYPE phase that specifies whether the cycle of the LPC protocol is a READ or a WRITE cycle, eight clock pulses for the ADDRESS phase, in which the address of the memory sector in which the host must read or write data is provided, and two pulses for the TAR and TAR-Z phases signaling the handing over of the control on the system bus. After these last two clock cycles, the standard memory FLASH_CORE engages the system bus through the bus PAD_EXT<3:0>.

Note that the memory device has received through an input interface all information necessary to carry out a READ command, through the sequence exemplified in FIG. 3. After the TAR phase, within the memory FLASH_CORE an "Address Transition Detection" (ATD) signal is produced and thus a reading, asynchronous with respect to the external clock CK, is started. The memory FLASH_CORE generates wait cycles, SYNC, during which it carries out internal operations. When the reading is completed, it outputs the read data and, by way of two further TAR cycles it transfers again the control of the system bus to the external host.

The state machine OUTPUT_LPC manages the transfer phase of the data read from the internal bus DBUS<7:0> to the output buffer OUT_BUFFER and, at the end of the process, it enables the output buffer to produce the read data on the output bus PAD_EXT<3:0>. The internal clock signal CK_IN is input to the state machine that controls the data stream OUTPUT_LPC and the state machine generates a logic enable signal OE of the output buffer after two periods of the internal clock signal CK_IN, as required by the specifications of the LPC protocol, thus loading the data present on the first internal bus DBUS<7:0> on the second internal bus BUSOUT<3:0>.

As stated before, the LPC specifications, as the specifications of similar protocols, establish a maximum output time starting from the rising edge of the external clock CK for producing the read data on the output bus. Such a maximum time delay TVAL must be respected each time the memory must load data on the first internal bus DBUS<7:0>. As depicted in FIG. 4, when two periods of the internal clock signal CK_IN have elapsed after that the data to be read had been made available on the internal data bus DBUS<7:0>, the state machine OUTPUT_LPC generates the enabling signal OE and produces the data to be read on the bus BUSOUT<3:0>. After a certain delay TOUT_BUF, introduced by the output buffer OUT_BUFFER, the data is finally produced on the output bus PAD_EXT<3:0>.

Because of propagation delays through the circuits of the output path, the data to be read is made available on the bus PAD_EXT<3:0> after a time TVAL from the rising edge of the external clock CK. The time TVAL is the sum of three contributions: the delay TIO_BUF of the internal clock signal CK_IN with respect to the external clock signal CK; the load time TBUSOUT of data read from the memory on the second internal bus BUSOUT<3:0>; and the delay introduced by the output buffer TOUT_BUF; thus $$TVAL = TIO\_BUF + TBUSOUT + TOUT\_BUF \qquad (1)$$

Without an accurate design of the circuits of the output path of the memory device, the time TVAL may easily exceed the maximum delay with respect to the rising edge of the external clock CK allowed by the particular protocol being used.

SUMMARY OF THE INVENTION

It is an object of the present invention to provide a memory device capable of outputting data read from the memory with a maximum delay from the rising edge of an external clock signal noticeably shorter than the delay experienced in known devices manufactured with the same fabrication technology. An aspect of this invention includes using master-slave pairs of flip-flops synchronized by respective timing signals and in loading the data to be output in the output buffer after a single clock pulse.

More precisely, an object of the invention is to provide a memory device including a standard memory core, an input buffer receiving an external clock signal and producing an internal clock signal, an output path of data read from the standard memory core comprising a state machine receiving the internal clock signal for controlling the data stream coupled to the output of the standard memory through a first internal data bus, and an output buffer coupled to the output of the state machine through a second internal bus and comprising an output stage enabled by the state machine for producing the read data on an output bus.

The memory device of the invention outputs the read data in a time starting from the rising edge of the external clock that is shorter than that of other known devices, because the output buffer has an array of master-slave pairs of flip-flops synchronized by respective timing signals derived from the internal clock signal. This array receives data from the state machine through the second internal bus and provides the data to be output to the output stage of the buffer enabled by the state machine. A logic circuit generates timing signals for the master-slave flip-flops, respectively as logic NAND and logic AND of the internal clock signal and of an enabling signal of the output stage of the buffer generated by the state machine. Moreover, the memory device comprises a circuit, synchronized by the internal clock signal, that introduces a delay of the enabling signal of the output stage of the buffer equivalent to a period of the internal clock signal.

Preferably, the enabling logic signal of the output stage of the buffer is generated after a period of the internal clock signal starting from the instant in which the data to be output is provided by the standard memory core to the state machine controlling the bit stream. The delay circuit may be a D type flip-flop that may be physically included either in the output buffer circuit block or in the state machine circuit block.

BRIEF DESCRIPTION OF THE DRAWINGS

The different aspects and advantages of the invention will become even more evident through a detailed description of an embodiment and by referring to the attached drawings, wherein:

FIG. 3 is a schematic diagram for comparing the sequence of FIG. 2 with the external clock signal of the memory device of FIG. 1;

FIG. 4 is a timing diagram illustrating the main signals of the device of FIG. 1;

DETAILED DESCRIPTION OF THE PREFERRED EMBODIMENTS

Figure 1:
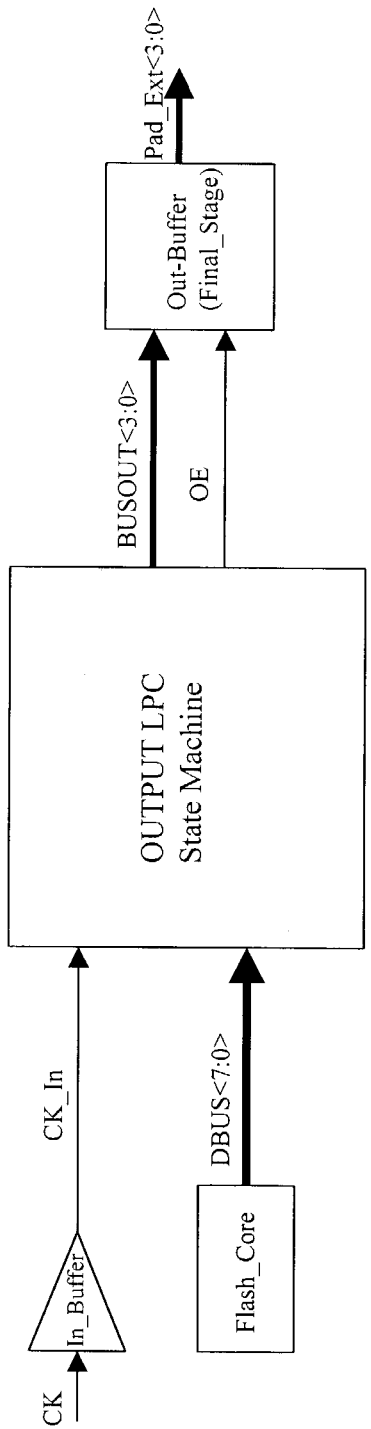
FIG. 1 is a basic diagram of a known memory device.
Figure 2:
FIG. 2 is a schematic diagram illustrating a possible asynchronous sequence of cycles in managing the memory device of FIG. 1.
Figure 5:
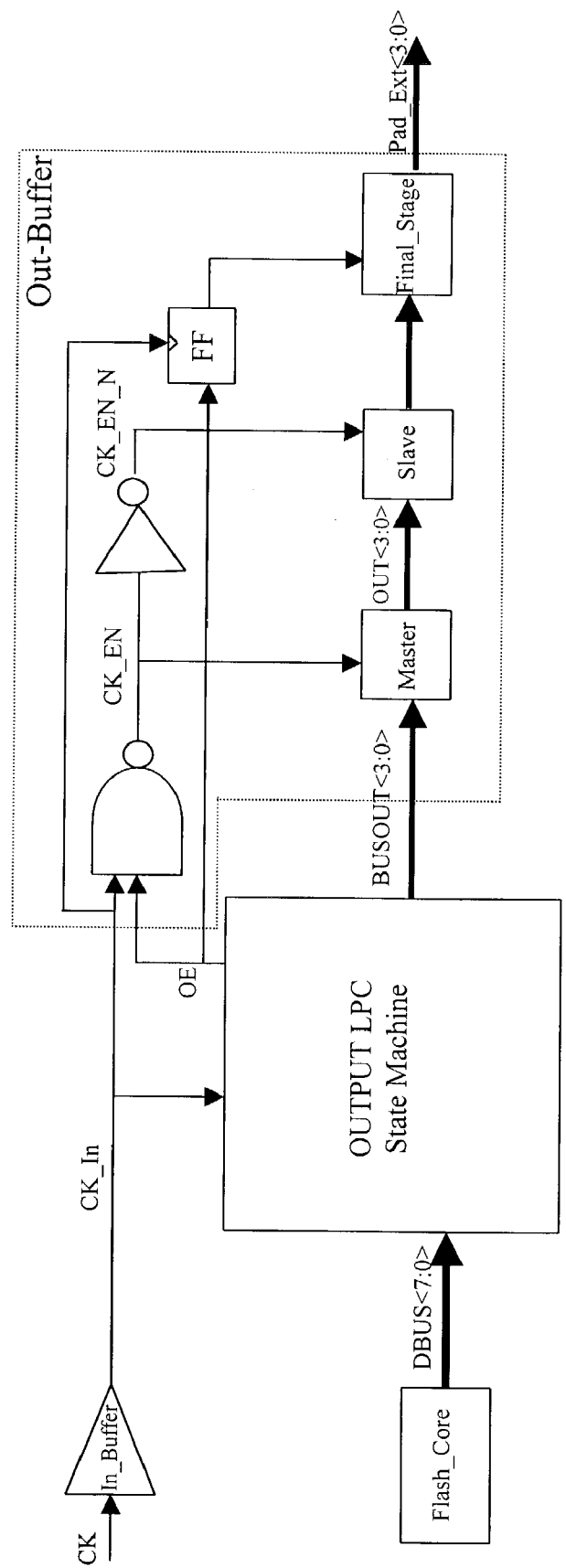
FIG. 5 is a basic diagram of a preferred embodiment of the memory device of the invention.

The output path of data from a standard memory FLASH_CORE, according to a preferred embodiment of the memory device of the invention, is depicted in FIG. 5. Different from known devices, the device of the invention has an output buffer including an array of master and slave flip-flop pairs MASTER SLAVE, receiving respective timing signals CK_EN and CK_EN_N. The output buffer further comprises a logic circuit for generating the timing signals CK_EN and CK_EN_N and a delay circuit FF of the output stages enabling signal OE, by a period of the internal clock signal CK_IN.

Figure 6:
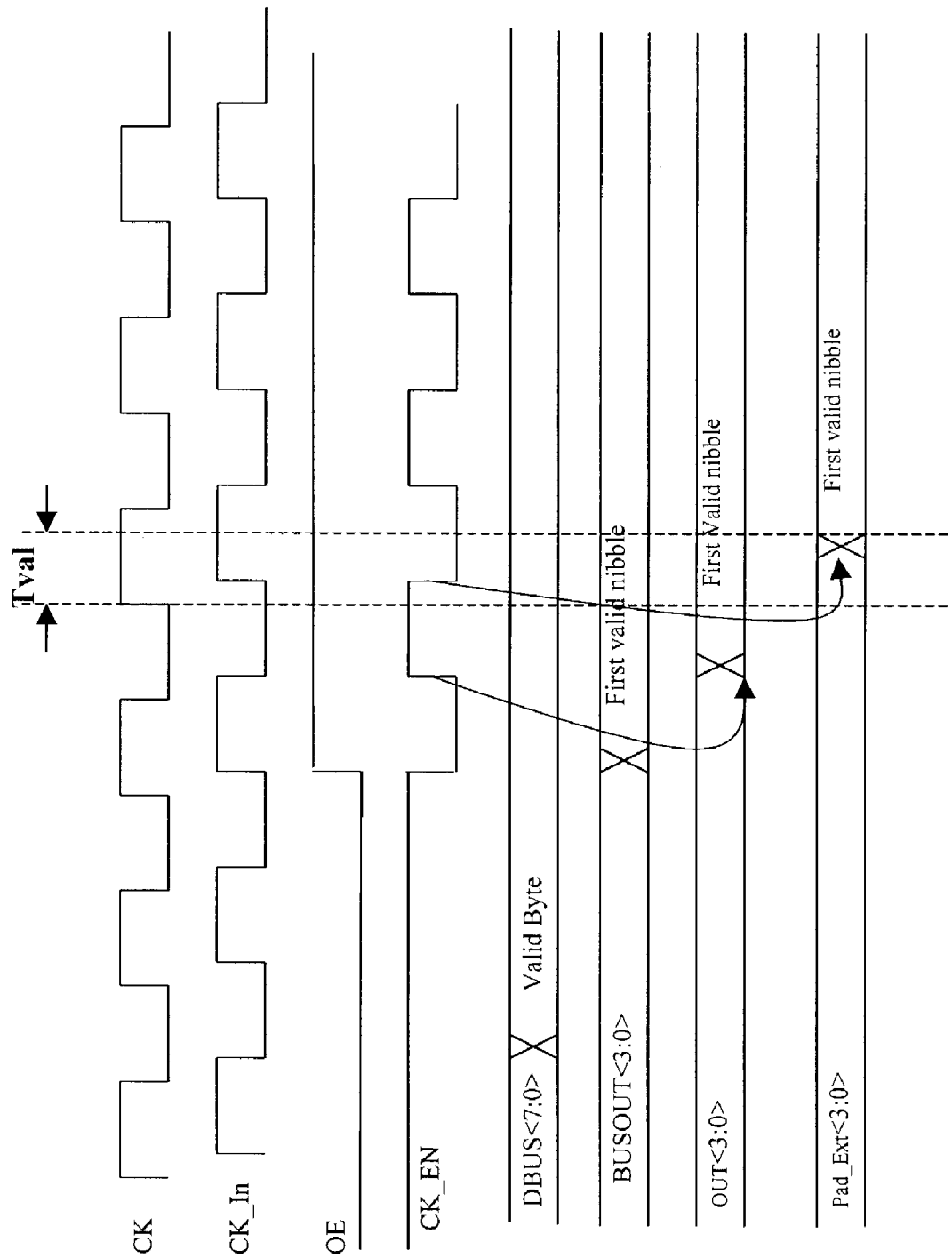
FIG. 6 is a timing diagram of the main signals of the device of FIG. 5.

As depicted in FIG. 6, when the output enabling signal OE is active, the timing signals CK_EN and CK_EN_N switch, because they are generated as logic NAND and logic AND, respectively, of the internal clock signal CK_IN and of the output enabling signal OE. The data to be read are provided on the bus BUSOUT<3:0> of the state machine OUTPUT_LPC, and on the successive rising edge of the CK_EN signal, the array of flip-flops MASTER read the data and inputs it to the array of flip-flops SLAVE through the bus OUT<3:0>. The flip-flops SLAVE read the signal present at their input on the rising edge of the CK_EN_N signal or, alternatively, on the falling edge of the signal CK_EN, and transfer it to the output stage FINAL_STAGE. This stage outputs data on the output bus PAD_EXT<3:0> when the enabling signal OE is active.

Once the signal OE is activated, the signal CK_EN_N is a replica of the external clock CK delayed by a time TIO_BUF introduced by the input stage IN_BUFFER. The output stage FINAL_STAGE thus receives the data to be placed on the output bus PAD_EXT<3:0> after a time TIO_BUF starting from the rising edge of the external clock CK. TOUT_BUF being the response time of the output stage FINAL_STAGE, data read from the memory is available on the output bus PAD_EXT<3:0> after a time TVAL from the rising edge of the external clock CK given by $$TVAL = TIO\_BUF + TOUT\_BUF \quad (2)$$

which is less than that (1) of known memory devices. Therefore, the memory device of the invention is better suited than the prior art devices for protocols like the well known PCI and SPI protocols, which place a stringent limit on the maximum value of TVAL.

Preferably, for not delaying the production of data on the output bus PAD_EXT<3:0> from the instant they are placed on the internal bus DBUS<7:0>, the output enabling signal OE is activated after a single period of the internal clock signal CK_IN from the instant in which the data to be output is provided to the state machine OUTPUT_LPC, as depicted in FIG. 6. However, this feature is optional for overcoming the considered technical problem.

It may be noted that generating the signal OE in advance by a clock period, compared to known memory devices, does not contravene any requirements of the considered protocol. In fact, the output stage FINAL_STAGE remains disabled for at least two periods of the internal clock signal from the instant in which the data to be output are provided to the state machine OUTPUT_LPC, as required by PCI protocols.

Preferably, the delay circuit FF includes a D type flip-flop, synchronized by the internal clock signal CK_IN. The delay circuit may even be incorporated in the circuitry of the state machine OUTPUT_LPC controlling the data stream. That is the machine may provide on distinct output nodes the enabling signal OE and a replica thereof delayed by a period of the internal clock, respectively, for the logic circuit that generates the timing signals of the master/slave flip-flop and for the output stage.

The memory device according to the invention may include either a volatile or a non volatile standard memory core and may use a PCI bus and a Low Pin Count type state machine OUTPUT_LPC.

That which is claimed is:

1. A memory device comprising:

a memory core;

an input buffer receiving an external clock signal and generating an internal clock signal;

an output path for data read from the memory core and comprising a first internal data bus, a state machine receiving the internal clock signal for controlling a data stream, the state machine being connected to an output of the memory core via the first internal data bus, and the state machine generating a control signal, a second internal bus, an output buffer connected to an output of the state machine via the second internal bus and comprising an output bus, an output stage controlled by said state machine for producing read data on the output bus, an array of master and slave pairs of flip-flops controlled by respective timing signals derived from the internal clock signal, and receiving data from said state machine on said second internal bus and providing, the data to the output stage for producing the data on said output bus, and a logic circuit generating the respective timing signals as the logic NAND and the logic AND of the internal clock signal and of the control signal of the output stage generated by said state machine, and a delay circuit, synchronized by the internal clock signal, and providing, to a control signal input of the output stage, a duplicate of the control signal delayed by a period of the internal clock signal.

2. The memory device of claim 1, wherein said output bus comprises a PCI bus, and said state machine for controlling the data stream implements a Low Pin Count protocol.

3. The memory device of claim 1, wherein the control signal is generated after the period of the internal clock signal starting from an instant at which the data to be output is provided to said state machine.

4. The memory device of claim 1, wherein said delay circuit comprises a D-type flip-flop synchronized by the internal clock signal.

5. The memory device of claim 1, wherein said delay circuit is integrated with the state machine.

6. The memory device of claim 1, wherein said memory core comprises a non volatile flash memory.

7. A memory device comprising:

a memory core;

a state machine connected to an output of the memory core and generating a control signal;

an output buffer connected to an output of the state machine and comprising an output stage controlled by the state machine for outputting read data, an array of master and slave pairs of flip-flops controlled by respective timing signals, and connected between the state machine and the output stage, and a logic circuit generating the respective timing signals; and a delay circuit providing a delayed control signal to the output stage based upon the control signal generated by the state machine.

8. The memory device of claim 7, wherein the respective timing signals are generated as the logic NAND and the logic AND of an internal clock signal and of the control signal of the output stage generated by the state machine.

9. The memory device of claim 8, wherein the control signal is generated after the period of the internal clock signal starting from an instant at which data to be output is provided to the state machine.

10. The memory device of claim 8, wherein the delay circuit comprises a D-type flip-flop synchronized by the internal clock signal.

11. The memory device of claim 7, wherein the state machine implements a Low Pin Count protocol.

12. The memory device of claim 7, wherein the delay circuit is integrated with the state machine.

13. The memory device of claim 7, wherein the memory core comprises a non volatile flash memory.

14. A method for controlling a memory device having a memory core, the method comprising:

generating a control signal with a state machine connected to an output of the memory core;

outputting read data with an output buffer connected to an output of the state machine and comprising an output stage controlled by the state machine for outputting read data, an array of master and slave pairs of flip-flops controlled by respective timing signals, and connected between the state machine and the output stage, and a logic circuit generating the respective timing signals; and providing a delayed control signal to the output stage based upon the control signal generated by the state machine.

15. The method of claim 14, wherein the respective timing signals are generated as the logic NAND and the logic AND of an internal clock signal and of the control signal of the output stage generated by the state machine.

16. The method of claim 15, wherein the control signal is generated after the period of the internal clock signal starting from an instant at which data to be output is provided to the state machine.

17. The method of claim 15, wherein the delayed control signal is provided by a delay circuit comprising a D-type flip-flop synchronized by the internal clock signal.

18. The method of claim 14, wherein the state machine implements a Low Pin Count protocol.

19. The method of claim 14, wherein the memory core comprises a non volatile flash memory.

* * * * *